(12) United States Patent
Millward et al.

(10) Patent No.: US 8,097,175 B2
(45) Date of Patent: Jan. 17, 2012

(54) METHOD FOR SELECTIVELY PERMEATING A SELF-ASSEMBLED BLOCK COPOLYMER, METHOD FOR FORMING METAL OXIDE STRUCTURES, METHOD FOR FORMING A METAL OXIDE PATTERN, AND METHOD FOR PATTERNING A SEMICONDUCTOR STRUCTURE

(75) Inventors: Dan B. Millward, Boise, ID (US); Timothy A. Quick, Boise, ID (US); J. Neil Greeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 359 days.

(21) Appl. No.: 12/259,921

(22) Filed: Oct. 28, 2008

(65) Prior Publication Data
US 2010/0102415 A1 Apr. 29, 2010

(51) Int. Cl.
*H01L 21/302* (2006.01)
*B82Y 40/00* (2011.01)

(52) U.S. Cl. ............. 216/17; 216/41; 216/51; 427/96.1; 427/98.4; 427/99.2; 427/271; 427/336; 427/341; 438/689; 438/694; 438/700; 438/705; 438/947; 977/888; 977/890

(58) Field of Classification Search ................... None
See application file for complete search history.

(56) References Cited

U.S. PATENT DOCUMENTS

| | | | |
|---|---|---|---|
| 4,797,357 A | 1/1989 | Mura et al. | |
| 5,512,131 A | 4/1996 | Kumar et al. | |
| 5,580,700 A | 12/1996 | Rahman | |
| 5,620,850 A | 4/1997 | Bamdad et al. | |
| 5,772,905 A | 6/1998 | Chou | |
| 5,879,853 A | 3/1999 | Azuma | |

(Continued)

FOREIGN PATENT DOCUMENTS
EP 1906237 2/2008
(Continued)

OTHER PUBLICATIONS

Clark et al., "Selective Deposition in Multilayer Assembly: SAMs as Molecular Templates," Supramolecular Science, vol. 4, pp. 141-146, (1997).

(Continued)

*Primary Examiner* — Anita Alanko
(74) *Attorney, Agent, or Firm* — TraskBritt (57) ABSTRACT

Methods of forming metal oxide structures and methods of forming metal oxide patterns on a substrate using a block copolymer system formulated for self-assembly. The metal oxide structures and patterns may be used, for example, as a mask for sublithographic patterning during various stages of semiconductor device fabrication. A block copolymer at least within a trench in the substrate and including at least one soluble block and at least one insoluble block may be annealed to form a self-assembled pattern including a plurality of repeating units of the at least one soluble block laterally aligned with the trench and positioned within a matrix of the at least one insoluble block. The self-assembled pattern may be exposed to a metal oxide precursor that impregnates the at least one soluble block. The metal oxide precursor may be oxidized to form a metal oxide. The self-assembled pattern may be removed to form a pattern of metal oxide lines on the substrate surface.

24 Claims, 4 Drawing Sheets

U.S. PATENT DOCUMENTS

| | | | |
|---|---|---|---|
| 5,948,470 A | 9/1999 | Harrison et al. | |
| 5,958,704 A | 9/1999 | Starzl et al. | |
| 6,207,787 B1 | 3/2001 | Fahey et al. | |
| 6,309,580 B1 | 10/2001 | Chou | |
| 6,414,164 B1 | 7/2002 | Afzali-Ardakani et al. | |
| 6,423,474 B1 | 7/2002 | Holscher | |
| 6,506,660 B2 | 1/2003 | Holmes et al. | |
| 6,517,933 B1 | 2/2003 | Soane et al. | |
| 6,518,194 B2 | 2/2003 | Winningham et al. | |
| 6,537,920 B1 | 3/2003 | Krivokapic | |
| 6,565,764 B2 | 5/2003 | Hiraoka et al. | |
| 6,592,764 B1* | 7/2003 | Stucky et al. | 210/660 |
| 6,635,912 B2 | 10/2003 | Ohkubo | |
| 6,656,308 B2 | 12/2003 | Hougham et al. | |
| 6,679,996 B1 | 1/2004 | Yao | |
| 6,780,492 B2 | 8/2004 | Hawker et al. | |
| 6,812,132 B2 | 11/2004 | Ramachandrarao et al. | |
| 6,825,358 B2 | 11/2004 | Afzali-Ardakani et al. | |
| 6,887,332 B1 | 5/2005 | Kagan et al. | |
| 6,911,400 B2 | 6/2005 | Colburn et al. | |
| 6,940,485 B2 | 9/2005 | Noolandi | |
| 6,952,436 B2* | 10/2005 | Wirnsberger et al. | 372/39 |
| 6,995,439 B1 | 2/2006 | Hill et al. | |
| 7,001,795 B2 | 2/2006 | Jiang et al. | |
| 7,009,227 B2 | 3/2006 | Patrick et al. | |
| 7,037,738 B2 | 5/2006 | Sugiyama et al. | |
| 7,045,851 B2 | 5/2006 | Black et al. | |
| 7,060,774 B2 | 6/2006 | Sparrowe et al. | |
| 7,087,267 B2 | 8/2006 | Breen et al. | |
| 7,112,617 B2 | 9/2006 | Kim et al. | |
| 7,115,305 B2* | 10/2006 | Bronikowski et al. | 427/249.1 |
| 7,119,321 B2 | 10/2006 | Quinlan | |
| 7,135,241 B2 | 11/2006 | Ferraris et al. | |
| 7,151,209 B2 | 12/2006 | Empedocles et al. | |
| 7,195,733 B2 | 3/2007 | Rogers et al. | |
| 7,332,370 B2 | 2/2008 | Chang et al. | |
| 7,347,953 B2 | 3/2008 | Black et al. | |
| 7,419,772 B2* | 9/2008 | Watkins et al. | 430/325 |
| 7,553,760 B2* | 6/2009 | Yang et al. | 438/637 |
| 7,655,383 B2* | 2/2010 | Mela et al. | 430/311 |
| 7,700,157 B2* | 4/2010 | Bronikowski et al. | 427/249.1 |
| 2001/0024768 A1 | 9/2001 | Matsuo et al. | |
| 2002/0167117 A1 | 11/2002 | Chou | |
| 2003/0034329 A1 | 2/2003 | Chou | |
| 2003/0068639 A1 | 4/2003 | Haneder et al. | |
| 2003/0080471 A1 | 5/2003 | Chou | |
| 2003/0080472 A1 | 5/2003 | Chou | |
| 2003/0108879 A1 | 6/2003 | Klaerner et al. | |
| 2003/0157248 A1 | 8/2003 | Watkins et al. | |
| 2003/0235930 A1 | 12/2003 | Bao et al. | |
| 2004/0058059 A1 | 3/2004 | Linford et al. | |
| 2004/0124092 A1 | 7/2004 | Black et al. | |
| 2004/0142578 A1 | 7/2004 | Wiesner et al. | |
| 2004/0163758 A1 | 8/2004 | Kagan et al. | |
| 2004/0256615 A1 | 12/2004 | Sirringhaus et al. | |
| 2005/0079486 A1 | 4/2005 | Abbott et al. | |
| 2005/0120902 A1 | 6/2005 | Adams et al. | |
| 2005/0250053 A1 | 11/2005 | Marsh et al. | |
| 2006/0035387 A1 | 2/2006 | Wagner et al. | |
| 2006/0097134 A1 | 5/2006 | Rhodes | |
| 2006/0128165 A1 | 6/2006 | Theiss et al. | |
| 2006/0134556 A1 | 6/2006 | Nealey et al. | |
| 2006/0137554 A1 | 6/2006 | Kron et al. | |
| 2006/0141245 A1 | 6/2006 | Stellacci et al. | |
| 2006/0163646 A1 | 7/2006 | Black et al. | |
| 2006/0231525 A1 | 10/2006 | Asakawa et al. | |
| 2006/0249784 A1 | 11/2006 | Black et al. | |
| 2006/0286297 A1* | 12/2006 | Bronikowski et al. | 427/248.1 |
| 2007/0045642 A1 | 3/2007 | Li | |
| 2007/0122749 A1 | 5/2007 | Fu et al. | |
| 2007/0181870 A1 | 8/2007 | Libertino et al. | |
| 2007/0183035 A1 | 8/2007 | Asakawa et al. | |
| 2007/0281220 A1 | 12/2007 | Sandhu et al. | |
| 2008/0038923 A1 | 2/2008 | Edelstein et al. | |
| 2008/0041818 A1 | 2/2008 | Kihara et al. | |
| 2008/0047930 A1 | 2/2008 | Blanchet et al. | |
| 2008/0064217 A1 | 3/2008 | Horii | |
| 2008/0073743 A1 | 3/2008 | Alizadeh et al. | |
| 2008/0083991 A1 | 4/2008 | Yang et al. | |
| 2008/0093743 A1 | 4/2008 | Yang et al. | |
| 2008/0102252 A1 | 5/2008 | Black et al. | |
| 2008/0103256 A1 | 5/2008 | Kim et al. | |
| 2008/0113169 A1 | 5/2008 | Cha et al. | |
| 2008/0174726 A1* | 7/2008 | Kim | 349/106 |
| 2008/0257187 A1 | 10/2008 | Millward | |
| 2009/0267058 A1* | 10/2009 | Namdas et al. | 257/40 |
| 2009/0317540 A1* | 12/2009 | Sandhu et al. | 427/126.3 |

FOREIGN PATENT DOCUMENTS

| | | |
|---|---|---|
| JP | 2005029779 | 3/2005 |
| JP | 2006110434 | 4/2006 |
| JP | 2007-194175 | 8/2007 |
| KR | 10-2006-0128378 | 12/2006 |
| WO | 02-18080 | 3/2002 |
| WO | 03045840 | 6/2003 |
| WO | 2006003592 | 1/2006 |
| WO | 2006003594 | 1/2006 |
| WO | 2006112887 | 10/2006 |
| WO | 2008055137 | 5/2008 |

OTHER PUBLICATIONS

Gates, "Nanofabrication with Molds and Stamps," Materials Today, pp. 44-49, (Feb. 2005).

Kuhnline et al., "Detecting thiols in a microchip device using micromolded carbon ink electrodes modified with cobalt phthalocyanine", Analyst, vol. 131, pp. 202-207, (2006), Published on web Nov. 23, 2005.

Kim et al., "Epitaxial self-assembly of block copolymers on lithographically defined nanopatterned substrates", Nature, vol. 24, pp. 411-414, (Jul. 2003).

Written Opinion of the International Searching Authority for International Application No. PCT/US2009/062117 dated Jun. 1, 2010, 3 pages.

International Search Report for International Application No. PCT/US2009/062117 dated Jun. 1, 2010, 3 pages.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, Applied Optics 44 (34) 7475-7482, Dec. 1, 2005.

Chai et al., Assembly of Aligned Linear Metallic Patterns on Silicon, Nature Nanotechnology, vol, 2, Aug. 2007, pp. 500-506.

Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595, published online Sep. 15.

Krishnamoorthy et al., Nonopatterned Self-Assembled Monolayers by Using Diblock Copolymer Micelles as nanometer-Scale Adsorption and Etch Masks, Advanced Materials, 2008, pp. 1-4.

Park et al., High-Aspect-Ratio Cylindrical Nanopore Arrays and Their Use for Templating Titania Nanoposts, Advanced Materials, vol. 20, pp. 738-742, 2008.

Park et al., Fabrication of Highly Ordered Silicon Oxide Dots and Stripes from Block Copolymer Thin Films, Advanced Materials, vol. 20, pp. 681-685, 2008.

Chen et al., Highly Ordered Arrays of Mesoporous Silica Nanorods with Tunable Aspect Ratios from Block Copolymer Thin Films, Advanced Materials, vol. 20, pp. 763-767, 2008.

Chai et al., Using Cylindrical Domains of Block Copolymers to Self-Assemble and Align Metallic Nanowires, American Chemical Society, www.Acsnano.org, 2008. pp. A-K, published online Feb. 5, 2008.

Cha et al., Biomimetic Approaches for Fabricating High-Density Nanopatterned Arrays, Chem. Mater. vol. 19, 2007, pp. 839-843, published on Web Jan. 20, 2007.

PCT International Search Report for Application No. PCT/US2008/060520, dated Sep. 11, 2008, 4 pages.

Yu et al., Contact Printing Beyond Surface Roughness: Liquid Supramolecular Nanostamping, Advanced Materials, vol. 19, 2007, pp. 4338-4342, published online Nov. 21, 2007.

Ji et al., Molecular Transfer Printing Using Block Copolymers, ACS Nano, vol. 4, No. 2, pp. 599-609, 2010, Published online Dec. 30, 2009.

Grubbs, Hybrid Metal-Polymer Composites from Functional Block Copolymers, Journal of Polymer Science: Part A: Polymer Chemistry, vol. 43, pp. 4323-4336 (2005).

Zhou et al., Nanoscale Metal/Self-Assembled Monolayer/Metal Heterostructures, American Institute of Physics, pp. 611-613 (1997), Appl Phys Lett 71(5), Aug. 4, 1997.

Black et al., Integration of Self-Assembled Diblock Copolymers for Semiconductor Capacitor Fabrication, Applied Physics Letters, vol. 79, No. 3, pp. 409-411 (2001), Jul. 16, 2001.

Sato et al., Novel Antireflective Layer Using Polysilane for Deep Ultraviolet Lithography, J. Vac. Sci. Technol. B, vol. 17, No. 6, pp. 3398-3401 (1999), Nov./Dec. 1999.

Cho et al., Nanoporous Block Copolymer Micelle/Micelle Multilayer Films with Dual Optical Properties, J. Am. Chem. Soc., vol. 128, No. 30, pp. 9935-9942 (2006), Published on Web Jul. 12, 2006.

Malenfant et al., Self-Assembly of an Organic-Inorganic Block Copolymer for Nano-Ordered Ceramics, Nature Nanotechnology, vol. 2, pp. 43-46 (2007), published online Jan. 3, 2007.

Zhao et al., Colloidal Subwavelength Nanostructures for Antireflection Optical Coatings, Optics Letters, vol. 30, No. 14, pp. 1885-1887 (2005), Jul. 15, 2005.

Yamaguchi et al., Resist-Pattern Guided Self-Assembly of Symmetric Diblock Copolymer, Journal of Photopolymer Science and Technology, vol. 19, No. 3, pp. 385-388 (2006).

Hadziioannou, Semiconductor Block Copolymers for Self-Assembled Photovoltaic Devices, MRS Bulletin, pp. 456-460 (2002), Jun. 2002.

Kavakli et al., Single and Double-Layer Antireflection Coatings on Silicon, Turk J Phys, vol. 26, pp. 349-354 (2002).

Fasolka et al., Block Copolymer Thin Films: Physics and Applications1, Annual Review, vol. 31, pp. 323-355 (2001).

Xia et al., An Approach to Lithographically Defined Self-Assembled Nanoparticle Films, Advanced Materials, vol. 18, pp. 930-933 (2006).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001), published on Web Apr. 8, 2001.

Xu et al., Interfacial Interaction Dependence of Microdomain Orientation in Diblock Copolymer Thin Films, Macromolecules, vol. 38, pp. 2802-2805 (2005), Published on Web Mar. 10, 2005.

Xu et al., Electric Field Alignment of Symmetric Diblock Copolymer Thin Films, Department of Polymer Science and Engineering, University of Massachusetts, 5 pages (2003).

Guarini et al., Nanoscale Patterning Using Self-Assembled Polymers for Semiconductor Applications, J. Vac. Sci. Technol. B 19(6), pp. 2784-2788, Nov./Dec. 2001.

Lopes et al., Hierarchical Self-Assembly of Metal Nanostructures on Diblock Copolymer Scaffolds, Nature, vol. 414, Dec. 13, 2001, pp. 735-738.

Horiuchi et al., Three-Dimensional Nanoscale Alignment of Metal Nanoparticles Using Block Copolymer Films as Nanoreactors, Langmuir, vol. 19, pp. 2963-2973 (2003), published on Web Feb. 28, 2003.

Tadd et al, Spatial Distribution of Cobalt Nanoclusters in Block Copolymers, Langmuir, vol. 18, pp. 2378-2384 (2002), published on Web Feb. 8, 2002.

Black, Charles T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Black, C.T., "Self-aligned self-assembly of multi-nanowire silicon field effect transistors," Appl. Phys. Lett., vol. 87, pp. 163116-1 through 163116-3, 2005.

Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.

Guarini, K.W., et al., "Nanoscale patterning using self-assembled polymers for semiconductor applications," J. Vac. Sci. Technol. B, vol. 19, No. 6, pp. 2784-2788, Nov./Dec. 2001.

Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006. available online Jun. 9, 2006.

Helmuth, Jo A., et al., "High-Speed Microcontact Printing," J. Am. Chem. Soc., vol. 128, No. 29, pp. 9296-9297, 2006, published on Web Jun. 29, 2006.

Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.

Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003, published on Web Feb. 6, 2003.

Johnson, Daniel L., et al., "Probing the stability of the disulfide radical intermediate of thioredoxin using direct electrochemistry," Letters in Peptide Science, vol. 10, pp. 495-500, 2003.

Jun, Yongseok, et al., "Microcontact Printing Directly on the Silicon Surface," Langmuir, vol. 18, No. 9, pp. 3415-3417, 2002, Published on Web Apr. 3, 2002.

Jun, Yongseok, et al., "Patterning protein molecules on poly(ethylene glycol) coated Si(111)," Biomaterials, vol. 25, pp. 3503-3509, 2004.

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007, published online Dec. 21, 2006.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007, published online Jan. 9, 2007.

Niu, Sanjun, et al., "Selective assembly of nanoparticles on block copolymer by surface modification," Nanotechnology, vol. 18, pp. 1-4, 2007, Feb. 2007.

Park, Sang-Min, et al., "Directed assembly of lamellae-forming block copolymers using chemically and topographically patterned substrates," 16 pages.

Reed, M.A., et al., "Molecular random access memory cell," Appl. Phys. Lett., vol. 78, No. 23, pp. 3735-3737, Jun. 2001.

Rozkiewicz, Dorota I., et al., "'Click' Chemistry by Microcontact Printing," Angew. Chem. Int. Ed., vol. 45, pp. 5292-5296, 2006, published online Jul. 12, 2006.

Ruiz, R., et al., "Induced Orientational Order in Symmetric Diblock Copolymer Thin-Films," submitted to Advanced Materials, 12 pages.

Xia, Younan, et al., "Soft Lithography," Annu. Rev. Mater. Sci., vol. 28, pp. 153-184, 1998.

Xu, F.J., et al., "Surface-Initiated Atom Transfer Radical Polymerization from Halogen-Terminated Si(111) (Si-X, X = Cl, Br) Surfaces for the Preparation of Well-Defined Polymer-Si Hybrids," Langmuir, vol. 21, No. 8, pp. 3221-3225, 2005, published on Web Mar. 8, 2005.

Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.

Zaumseil et al., "Three-Dimensional and Multilayer Nanostructures Formed by Nanotransfer Printing," Nano Letters, 2003, vol. 3, No. 9, pp. 1223-1227, published on Web Jul. 31, 2003.

Zehner, Robert W., et al., "Selective Decoration of a Phase-Separated Diblock Copolymer with Thiol-Passivated Gold Nanocrystals," Langmuir, vol. 14, No. 2, pp. 241-243, Jan. 20, 1998.

Zhang et al., "Self-Assembled Monolayers of Terminal Alkynes on Gold," J. Am. Chem. Soc., vol. 129, No. 16, pp. 4876-4877, 2007, Published on Web Mar. 31, 2007.

Zhu, X.Y., et al., "Grafting of High-Density Poly(Ethylene Glycol) Monolayers on Si(111)," Langmuir, vol. 17, pp. 7798-7803, 2001, Published on Web Nov. 8, 2001.

Zhu, X.Y., et al., "Molecular Assemblies on Silicon Surfaces via Si-O Linkages," Langmuir, vol. 16, pp. 6766-6772, 2000, Published on Web Jul. 29, 2000.

Marsh et al., U.S. Appl. No. 11/766,663, filed Jun. 21, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Black et al., Polymer Self Assembly in Semiconductor Microelectronics, IBM J. Res. & Dev. vol. 51, No. 5, Sep. 2007, pp. 605-633.

Krishnamoorthy et al., Block Copolymer Micelles as Switchable Templates for Nanofabrication, Languir, vol. 22, No. 8, Mar. 17, 2006, pp. 3450-3452.

Huang et al., "Using Surface Active Random Copolymers to Control the Domain Orientation in Diblock Copolymer Thin Films," Macromolecules, 1998, 31, 7641-7650, Published on Web Oct. 10, 1998.

* cited by examiner

METHOD FOR SELECTIVELY PERMEATING A SELF-ASSEMBLED BLOCK COPOLYMER, METHOD FOR FORMING METAL OXIDE STRUCTURES, METHOD FOR FORMING A METAL OXIDE PATTERN, AND METHOD FOR PATTERNING A SEMICONDUCTOR STRUCTURE

CROSS-REFERENCE TO RELATED APPLICATIONS

This application is related to U.S. patent application Ser. No. 11/766,663, filed Jun. 21, 2007, pending, for MULTI-LAYER ANTIREFLECTION COATINGS, STRUCTURES AND DEVICES INCLUDING THE SAME AND METHODS OF MAKING THE SAME. This application is also related to U.S. patent application Ser. No. 11/787,928, filed Apr. 18, 2007, now U.S. Pat. No. 7,959,975, issued Jun. 14, 2011, for METHODS OF PATTERNING A SUBSTRATE.

TECHNICAL FIELD

The invention, in various embodiments, relates generally to methods for selectively permeating self-assembled block copolymers with metal oxides to form metal oxide structures, to methods of forming semiconductor structures using such metal oxide structures, and to semiconductor structures including the metal oxide structures.

BACKGROUND

The economics (i.e., cost per die) of electronic components improves significantly as feature size becomes smaller. As the size of device features becomes ever smaller, conventional lithographic processes become increasingly more difficult and expensive to use. Therefore, significant challenges are encountered in the fabrication of nanostructures, particularly structures having a feature size of less than 50 nm.

It is possible to fabricate isolated or semi-dense structures at this scale using a conventional lithographic process such as, for example, nanoimprint lithography, laser interferometry, extreme ultraviolet interference lithography, shadow mask lithography, e-beam lithography, or scanning-probe-microscopy-based lithography. However, such techniques are limited because the exposure tools are extremely expensive or extremely slow and, further, may not be amenable to formation of structures having dimensions of less than 50 nm.

The development of new processes and materials is of increasing importance in making fabrication of small-scale devices easier, less expensive, and more versatile. One example of a method of patterning that addresses some of the drawbacks of conventional lithographic techniques is block copolymer lithography, where use is made of polymer masks derived from self-assembly of block copolymers. Block copolymers are known to form nano-scale microdomains by microphase separation. When cast on a substrate and annealed, block copolymers form nano-scale periodic patterns that may be useful as an etch mask in semiconductor device fabrication. Such ordered patterns of isolated nano-sized structural units formed by the self-assembled block copolymers may potentially be used for fabricating periodic nano-scale structural units and, therefore, have promising applications in semiconductor, optical, and magnetic devices. Dimensions of the structural units so formed are typically in the range of 5 nm to 50 nm, which dimensions are extremely difficult to define using conventional lithographic techniques. The size and shape of these domains may be controlled by manipulating the molecular weight and composition of the copolymer. Additionally, the interfaces between these domains have widths on the order of 1 nm to 5 nm and may be controlled by changing the chemical composition of the blocks of the copolymers. However, the domains of the self-assembling block copolymers often have little or no etch selectivity for one another. Therefore, improving etch selectivity of the self-asssembled domains is desirable.

Buriak and Chai, "Assembly of Aligned Linear Metallic Patterns on Silicon," *Nature Nanotechnology*, 2, 500-506 (Aug. 2007), discloses forming aligned metal lines by metal loading self-assembled monolayers of aligned, horizontal block copolymer cylinders using an aqueous solution of an anionic metal complex.

Cha et al., "Biometric Approaches for Fabricating High-Density Nanopatterned Arrays," *Chem Mater.*, 19, 839-843 (2007) discloses using the self-assembling properties of AB diblock copolymers to make polymer thin films as nanometer etch masks. A more etch-resistant film is formed by enriching the domains within the block polymer thin films with metals such as silicon.

Chai and Buriak, "Using Cylindrical Domains of Block Copolymers to Self-Assemble and Align Metallic Nanowires," *ACS Nano*, 2(3), 489-501 (2008), discloses metal ion loading of self-aligned polystyrene-poly(2-vinylpyridine) block copolymers on silicon surfaces using aqueous solutions of anionic metal complexes. The basic poly(2-vinylpyridine) is protonated, rendering it cationic so that electrostatic attraction leads to a high local concentration of metal complexes within the poly(2-vinylpyridine) domain. A plasma etching process is performed to remove the polymer and form metallic nanowires.

To achieve higher-density circuits, storage devices, or displays, there is a need for less expensive fabrication techniques which are suitable for fabricating complex devices with the required enhanced density and reliable addressability of elements to meet future demands.

DETAILED DESCRIPTION

As discussed in further detail below, in some embodiments, the present invention comprises methods of selective permeation or impregnation of metal oxides into a self-assembled block copolymer and methods of forming metal oxide structures utilizing the controlled formation of block copolymers. In other embodiments, the present invention includes a semiconductor structure including a pattern of such metal oxide structures.

As used herein, the term "substrate" means and includes a base material or construction upon which materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "block copolymer" means and includes polymers that include one or more long sequences (i.e., "blocks") of the same monomeric unit(s) covalently bound to one or more long sequences (i.e., "blocks") of unlike type, for example, including differing monomeric unit(s). A wide variety of block copolymers are contemplated herein including diblock copolymers (copolymers having two blocks), triblock copolymers (copolymers having three blocks), multiblock copolymers (copolymers having more than three blocks), and combinations thereof.

The term "phase separation," as used herein means and includes the properties by which homogenous polymers or homogenous segments of a block copolymer aggregate mutually, and heterogeneous polymers or heterogeneous segments separate into distinct domains.

The term "annealing" or "anneal" as used herein means and includes treatment of the block copolymer so as to enable sufficient phase separation between the two or more different polymeric block components of the block copolymer to form an ordered pattern defined by repeating structural units. Annealing of the block copolymer in the present invention may be achieved by various methods known in the art, including, but not limited to: thermal annealing (either in a vacuum or in an inert atmosphere containing nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The term "preferential wetting," as used herein, means and includes wetting of a block copolymer wherein one block of the block copolymer will wet a contacting surface at an interface more easily than the other block(s).

The following description provides specific details, such as material types, material thicknesses, and processing conditions in order to provide a thorough description of embodiments of the invention. However, a person of ordinary skill in the art will understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor device in which the metal oxide structure is present, and the semiconductor devices described below do not form a complete electronic device. Only those process acts and metal oxide structures or semiconductor devices necessary to understand the embodiments of the invention are described in detail below. Additional processing acts to form a complete semiconductor device from the metal oxide structures or to form a complete electronic device from the semiconductor device may be performed by conventional fabrication techniques, which are not described herein.

The materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

Reference will now be made to the figures, wherein like numerals represent like elements. The figures are not necessarily drawn to scale.

Figure 1:
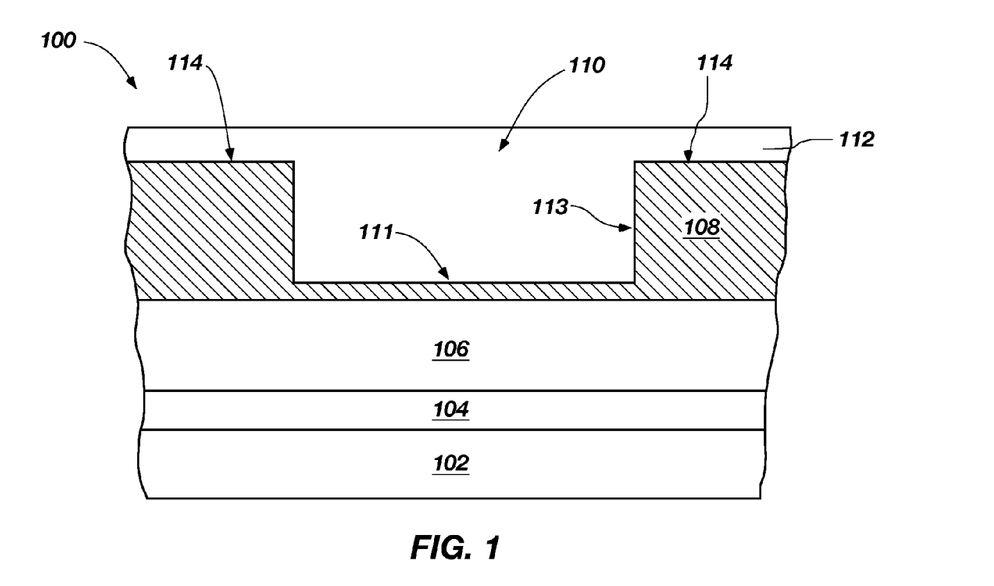
FIG. 1 is a partial cross-sectional view illustrating an embodiment of a method that may be used to fabricate metal oxide structures on a semiconductor structure.

FIG. 1 is a partial cross-sectional schematic view of an embodiment of a semiconductor structure 100 of the present invention. The semiconductor structure 100 may be provided, which, includes a substrate 102, a dielectric material 104, a semiconductive material 106, and an insulative material 108. The substrate 102, as previously discussed, may comprise a full or partial wafer of semiconductor material or a material such as glass or sapphire. The dielectric material 104 may be provided over and in contact with a surface of the substrate 102. By way of example and not limitation, the dielectric material 104 may include silicon oxynitride (SiON), silicon nitride ($Si_3N_4$), silicon dioxide ($SiO_2$), another oxide material, or a polymer material, and may be formed using, for example, CVD, PVD, or ALD. The semiconductive material 106 may include, for example, a doped polysilicon material and may be formed over and in contact with the dielectric material 104 using conventional techniques, which are not described in detail herein. The insulative material 108 may include an oxide such as silicon dioxide ($SiO_2$), and may be formed by CVD, by decomposing tetraethylorthosilicate (TEOS), or by any other process known in the art of integrated circuit fabrication.

Referring still to FIG. 1, the semiconductor structure 100 may have a trench 110 formed therein, the trench 110 filled with a block copolymer material 112. The trench 110 may be defined by a lower surface 111 and sidewalls 113 of the insulative material 108. For the sake of clarity, the semiconductor structure 100 depicted in the following drawings includes one trench 110 formed partially through a thickness of the insulative material 108. In other embodiments, a plurality of trenches 110 may be formed in the semiconductor structure 100. The trenches 110 may be formed through a thickness of any of the underlying materials such as the semiconductive material 106, the dielectric material 104, and the substrate 102. The trench 110 may have a depth sufficient to form a monolayer of the block copolymer material 112, which is described in further detail below. For example, the trench 110 may have a depth in a range of from about 15 nm to about 50 nm, and may be formed using, for example, patterning techniques (e.g., masking and etching) known in the art of integrated circuit fabrication. Additionally, in some embodiments, another dielectric material (not shown), such as silicon dioxide, may be formed over the sidewalls 113 and the lower surface 111 of the trenches 110 using a process such as atomic layer deposition (ALD). As a non-limiting example, the another dielectric material may be a thin, conformal film of a material that preferential wets a minority domain of the block copolymer material 112, as will be described in further detail herein.

Referring still to FIG. 1, the block copolymer material 112 may be provided over the semiconductor structure 100 (i.e., an exposed surface of the insulative material 108 and within the trench 110). By way of example and not limitation, the block copolymer material 112 may be deposited over the semiconductor structure 100 to a thickness sufficient to fill the trench 110 and to overlie surfaces 114 of the insulative material 108. As a non-limiting example, the block polymer material 112 overlying the surfaces 114 of the insulative material 108 may be applied to have a thickness of less than or equal to a monolayer of the block copolymer material 112. The block copolymer material 112 may be applied by any suitable technique such as, for example, spin casting, spin coating, spraying, ink coating, or dip coating.

The block copolymer material 112 may include at least two copolymer blocks that are substantially immiscible in one another. By way of non-limiting example, the block copolymer material 112 may be a diblock copolymer that includes a hydrophilic block and a hydrophobic block, which may be capable of undergoing phase separation, which is described in further detail below. The block copolymer material 112 may include the hydrophilic block and the hydrophobic block at a ratio in a range of from about 80:20 by weight to about 50:50 by weight and, more specifically, at a ratio of about 70:30 by weight.

The hydrophilic block may include a polymer formulated for swelling or wetting upon contact with a solvent, such as an alcohol. By way of non-limiting example, the hydrophilic block polymer may include polyvinylpyridine (PVP), hydroxypropyl methylcellulose (HPMC), polyethylene glycol (PEG), poly(ethylene oxide)-co-poly(propylene oxide) di- or multiblock copolymers, poly(ethylene oxide) (PEO), poly(vinyl alcohol) (PVA), poly(ethylene-co-vinyl alcohol), poly(acrylic acid), poly(ethyloxazoline), a poly(alkylacrylate), poly(acrylamide), a poly(N-alkylacrylamide), a poly(N,N-dialkylacrylamide), poly(propylene glycol) (PPG), poly(propylene oxide), partially or fully hydrolyzed poly(vinyl alcohol), dextran, and copolymers and combinations thereof.

The hydrophobic block may include a polymer insoluble in the solvent, such as an alcohol, which results in swelling or wetting the hydrophilic block upon contact. As a non-limiting example, the hydrophobic block may include polystyrene (PS), polyethylene (PE), polypropylene (PP), polychloroprene (CR), a polyvinyl ether, poly(vinyl acetate) ($PVA_c$), poly(vinyl chloride) (PVC), a polysiloxane, a polyurethane (PU), a polyacrylate, a polyacrylamide, and copolymers and mixtures thereof.

By way of non-limiting example, block copolymer materials 112 that may be used for forming the self-assembled copolymer may include polystyrene-block-polyvinylpyridine (PS-b-PVP), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). As described above, the block copolymer may be a diblock copolymer. However, block copolymers having three (a triblock copolymer) or more (a multiblock copolymer) blocks may also be used. One example of a triblock copolymer includes, but is not limited to, poly(styrene-block methyl methacrylate-block-ethylene oxide). Multiblock copolymers may have three or more blocks selected from the following: polystyrene, polymethylmethacrylate, polyethyleneoxide, polyisoprene, polybutadiene, poly lactic acid, polyvinylpyridine, and combinations thereof.

Figure 2:
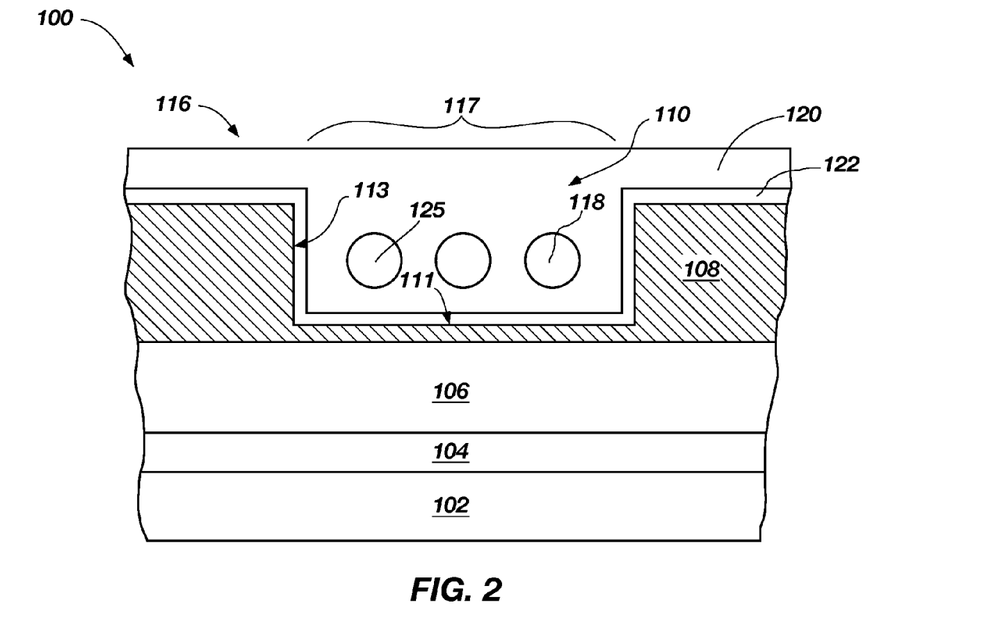
FIG. 2 is a partial cross-sectional view illustrating an embodiment of a method that may be used to fabricate metal oxide structures on a semiconductor structure.

Referring to FIG. 2, an annealing process may be used to initiate phase separation between the copolymer blocks of the block copolymer material 112. The block copolymer material 112 may be annealed using, for example, thermal annealing, solvent vapor-assisted annealing, supercritical fluid-assisted annealing, or a combination thereof, which is described in further detail below. During annealing, the block copolymer material 112 may undergo phase separation wherein the sidewalls 113 of the trench 110 guide self-assembly, or self-registration, of the copolymer blocks of the block copolymer material 112, which is often referred to as "graphoepitaxy," so as to form a plurality of ordered domains 118 including at least one copolymer block within a matrix 120 of at least one different copolymer block. The ordered domains 118 may include repeating structural units having a regular or defined order. Specifically, the lower surface 111 and the sidewalls 113 of the trench 110 may be most preferentially wetted by at least the minority block of the at least two copolymer blocks of the block copolymer material 112. The preferential wetting of the minority copolymer block with both the lower surface 111 and sidewalls 113 of the trench 110 results in the formation of the ordered domains 118 within the trench 110.

Each of the domains 118 includes self-aggregated minority block portions of polymer chains held together by a non-covalent bond and is aligned parallel to an axis of the trench 110. By way of non-limiting example, phase separation of the block copolymer material 112 may result in the formation of a self-assembled film 116 including an ordered array 117 of domains 118 surrounded by the matrix 120. For example, where the block copolymer material 112 includes the hydrophilic block and the hydrophobic block, the domains 118 may include the hydrophilic block, and the matrix 120 may include the hydrophobic block. The number of domains 118 may be determined by the width of the trench 110 together with the inherent periodicity (Lo). Based on the periodicity (Lo) of the copolymer, the width of the trench 110 may be controlled to form a number (n) of trenches determined width/periodicity, which may be for example, sufficient to form a number of domains 118 in a range of from about one to about fifty (50). Additionally, an interface material 122 including the hydrophilic block may form at an interface between the matrix 120 and the underlying material of the insulative material 108.

For the sake of clarity, the domains 118 are shown in FIG. 2 as cylinders having an axis 125 parallel to the substrate 102 and horizontally aligned with sidewalls 113 of the trench 110 (i.e. parallel to a surface 111 of the trench 110). By way of non-limiting example, the domains 118 may be cylinders having a diameter in a range of from about 5 nm to about 50 nm. The length of the domains 118 may be substantially equal to the length of the trench 110. The morphology of the self-assembled film 116, including the size and shape of the domains 118, may be controlled by the molecular weight and volume fraction of the copolymer blocks of the block copolymer to produce lamellar, cylindrical or spherical morphologies, among others. By way of non-limiting example, when the block copolymer material 112 includes polyvinylpyridine and polystyrene at a ratio of between about 80:20 and 60:40, lamellar domains or alternating cylinders, often referred to as "stripes" of the polyvinylpyridine may be formed. In other embodiments, the domains 118 may be spherical units, hexagonal units, or any other shape that may be formed by the phase separation of the block copolymer material 112.

In some embodiments, the block copolymer material 112 may be heated to a temperature at or above a glass transition temperature and below a decomposition temperature of the copolymer blocks either in a vacuum or in an inert atmosphere, to cause the block copolymer material 112 to phase separate and form the self-assembled film 116. The inert atmosphere may include, by way of non-limiting example, nitrogen or argon. For example, the block copolymer material 112 may be heated to a temperature in a range of from about 130° C. to about 275° C.

In additional embodiments, the block copolymer material 112 may be exposed to a solvent vapor to cause phase separation and the formation of ordered domains 118. The solvent vapor may be formed by converting a solvent capable of initiating phase separation to the gas phase. By way of non-limiting example, the solvent vapor may be formed from toluene, tetrahydrofuran, dimethylformamide, and combinations thereof. For example, the block copolymer material 112 may be annealed exposing the block copolymer material 112 to toluene vapor at a temperature of greater than or equal to about 24° C.

By way of non-limiting example, when the copolymer block material 112 is polystyrene-block-polyvinylpyridine, the polyvinylpyridine may preferentially wet the lower surface 111 and sidewalls 113 of the trench 110 during the annealing process, while the polystyrene may preferentially wet the air interface, resulting in the formation of the interface material 122 of polyvinylpyridine as well as repeating cylindrical domains 118 including polyvinylpyridine, each having an axis 125 parallel to an axis of the trench 110 and disposed within the matrix 120 including polystyrene.

Figure 3:
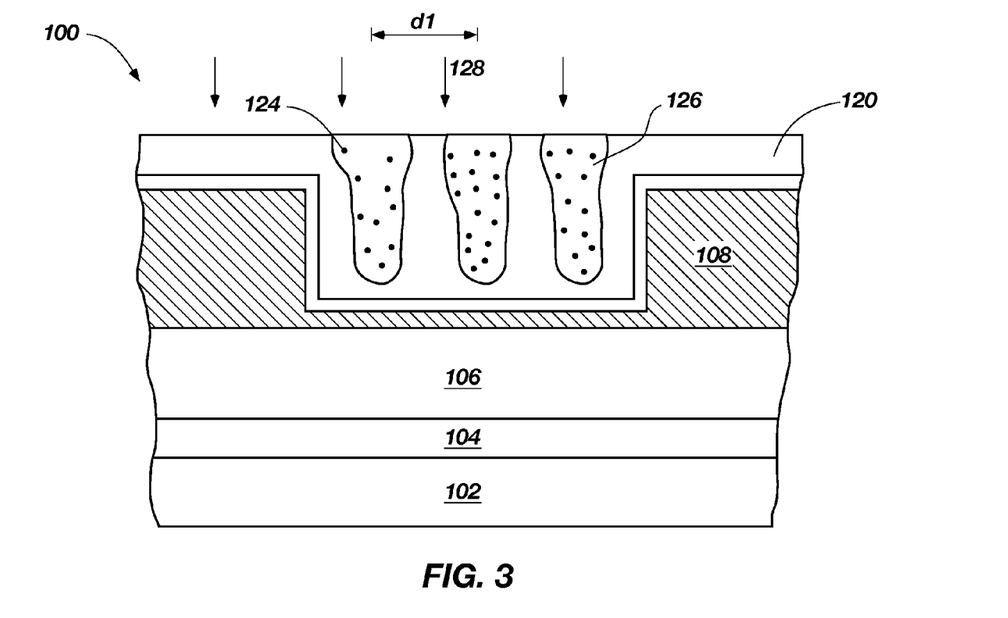
FIG. 3 is a partial cross-sectional view illustrating an embodiment of a method that may be used to fabricate metal oxide structures on a semiconductor structure.

Referring to FIG. 3, the self-assembled film 116 shown in FIG. 2 may be exposed to a swelling agent, which may permeate at least a portion of the ordered domains 118 (FIG. 2) resulting in the formation of swollen domains 126. The swelling agent may cause a region of the swollen domains 126 to swell or rupture as shown in FIG. 3, while remaining regions of the swollen domains 126 may maintain a shape substantially identical to or similar to a shape of the ordered domains 118 (FIG. 2). The swelling agent may laterally permeate the remaining regions of the swollen domains 128 via the intermittent regions that have swollen or ruptured. In some embodiments, the swelling agent may include a metal oxide precursor and may be introduced to form swollen domains impregnated with the metal oxide precursor 124. The swelling agent may be applied to the self-assembled film 116 under anhydrous conditions such as, for example, in an atmosphere of an inert gas. By way of non-limiting example, the swollen domains 126 may have a mushroom-like shape. The swollen domains 126 may be laterally spaced from one another by a distance d1. The distance d1 may be, for example, less than or equal to about 50 nm, and more specifically, in a range of from about 5 nm to about 30 nm.

In some embodiments, the swelling agent comprises polar solvent, such as an alcohol, and may be applied to form the swollen domains 126 prior to exposure to a metal oxide precursor. In additional embodiments, the swelling agent may include only the metal oxide precursor 124, or may include a mixture of a solvent, such as a polar solvent, and the metal oxide precursor 124, and may selectively solubilize or permeate the domains 118 (FIG. 2) without substantially solubilizing or substantially permeating the matrix 120. The metal oxide precursor 124 may be a metal-containing compound capable of selectively impregnating the domains 118 such as, for example, a cationic metal, a metal alkoxide, or a metal salt (e.g., a metal halide). As a non-limiting example, the metal oxide precursor 124 may be an isopropoxide, such as titanium tetraisopropoxide ($C_{12}H_{28}O_4Ti$), tetraethylorthosilicate (TEOS), or poly(dimethylsiloxane) (PDMS). The solvent may be a liquid, gas, or vapor capable of swelling or wetting the domains 118 (FIG. 2) without substantially wetting or substantially swelling the matrix 120. The solvent may include, for example, a polar organic solvent, such as an alcohol, or water, or combinations thereof. If the domains 118 are formed from the hydrophilic polymer and the matrix 120 is formed from the hydrophobic polymer, the polar solvent may permeate the hydrophilic polymer without substantially permeating the hydrophobic polymer.

By way of non-limiting example, the self-assembled film 116 (FIG. 2) may be soaked in a solvent so that the domains 118 open and swell to form swollen domains 126, as shown in FIG. 3. Thereafter, the polymer material in the swollen domains 126 may be cross-linked in this soaked, extended form. Finally, the swollen domains 126 may be exposed to the metal oxide precursor 124. By cross-linking the polymer material after formation of the swollen domains 126, buckling or wrinkling resulting from swelling may be substantially reduced or prevented.

Additionally, the swelling agent including the metal oxide precursor 124 may be applied to the self-assembled film 116 as a mixture of an alcohol, such as methanol, ethanol, or isopropanol, and titanium tetraisopropoxide having a volumetric ratio of about 2:1. As another non-limiting example, the swelling agent may be poly (dimethylsiloxane) dissolved in a solvent, which may be applied over the domains 118 by, for example, by spin-casting, and may be heated to about 80° C. and soaked for at least 6 hours to selectively permeate the domains 118.

In additional embodiments, the swelling agent may include a neat metal oxide precursor 124 such as, for example, tetraethylorthosilicate, which may be applied to the self-assembled film 116 in the absence of another solvent. Upon contact with the self-assembled film 116, the metal oxide precursor 124 of the swelling agent may be absorbed into the domains 118 (FIG. 2), forming the swollen domains 126 impregnated with the metal oxide precursor 124. The self-assembled film 116 may be exposed to the metal oxide precursor 124 for an amount of time sufficient for the metal oxide precursor 124 to impregnate the domains 118, for example, from about 30 minutes to about 5 hours and, more specifically, for about 1 hour. After formation of the swollen domains 126, the semiconductor structure 100 may, optionally, be rinsed using a solution including another solvent such as, for example, a polar organic solvent or water.

Referring still to FIG. 3, the swollen domains 126 may be exposed to an oxidizing agent (represented by directional arrows 128), which converts the metal oxide precursor 124 within the swollen domains 126 to a metal oxide (not shown). The oxidizing agent 128 may be, for example, air, oxygen, nitrogen dioxide, water, nitrogen tetroxide, ozone, or combinations thereof. By way of non-limiting example, the metal oxide precursor 124 may be exposed to the oxidizing agent 128 in a sealed chamber for a length of time in a range of from about 1 minute to about 30 hours and, more particularly, about 16 hours. By way of non-limiting example, when the metal oxide precursor 124 is titanium tetraisopropoxide, water vapor may be applied to the swollen domains 126 in a reaction chamber for about 16 hours to form titanium dioxide. As another non-limiting example, when the metal oxide precursor 124 is tetraethylorthosilicate, water vapor may be applied to the swollen domains 126 in a reaction chamber for about 16 hours to form silicon dioxide.

Figure 4:
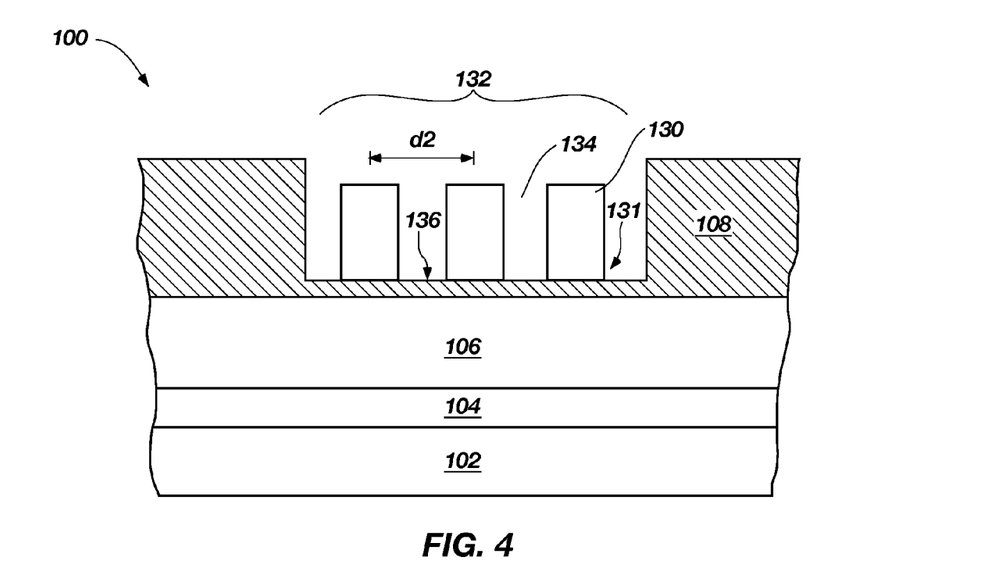
FIG. 4 is a partial cross-sectional view illustrating an embodiment of a method that may be used to fabricate metal oxide structures on a semiconductor structure.

As shown in FIG. 4, in some embodiments, a dry etching process, such as a reactive ion etching (RIE), plasma etching process, a reactive ion beam etching process, or a chemically assisted ion beam etching process, may be performed to remove a portion of the matrix 120 from the semiconductor structure 100 leaving the metal oxide structures 130. A portion of the matrix 120 may remain after etching to form a lower region 131 of each of the metal oxide structures 130. The dry etching process may be performed such that each of the metal oxide structures 130 may have an upper surface below a surface of the insulative material 108 and may include a region 131 that includes the matrix 120. As a non-limiting example, if the matrix 120 is polystyrene, an anisotropic reactive ion (i.e., plasma) etching process using oxygen as the etchant may be performed to remove the polystyrene. The dry etch may, optionally, remove at least a portion of polymer material remaining in the swollen domains 126 and the interface material 122.

Figure 5:
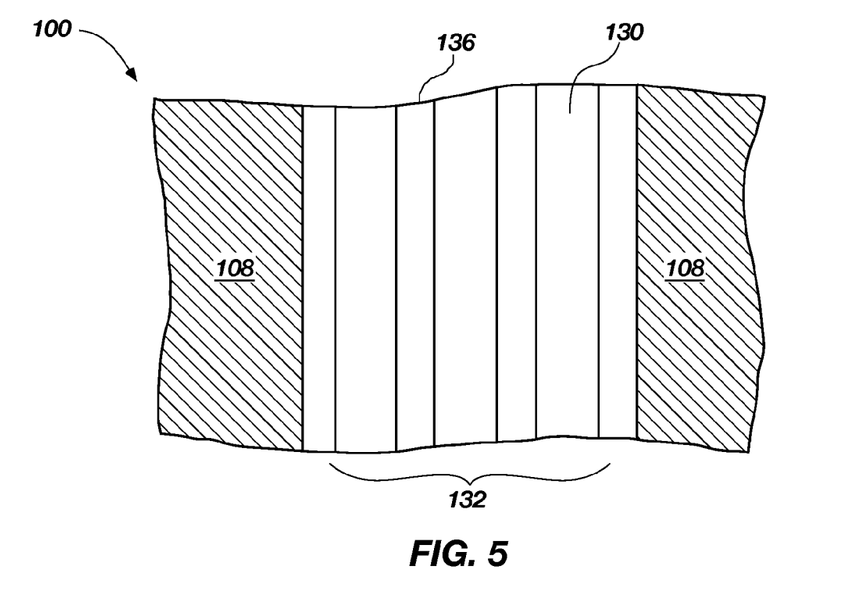
FIG. 5 is a top-down plan view of the embodiment of the semiconductor structure shown in FIG. 4.

As a result of removing the matrix 120, and optionally, the polymer material remaining in the swollen domains 126 and the interface material 122, a pattern 132 of laterally spaced metal oxide structures 130 may remain on the surface of the semiconductor structure 100. The metal oxide structures 130 may include a metal oxide material. The metal oxide structures 130 may be laterally spaced from one another by a distance d2 (i.e., the center-to-center distance between metal oxide structures 130), which may be about one-half the distance d1 (i.e., the center-to-center distance between swollen domains 126 shown in FIG. 3). A portion of the insulative material 108 may be exposed through apertures 134 between each of the metal oxide structures 130. FIG. 5 is a top-down view of the semiconductor structure 100 of FIG. 4.

Additionally, a portion of the matrix 120 may be removed using a conventional calcination process in a reactive ambient gas, such as oxygen or ammonia, to remove remaining organic residues. The resulting metal oxide structures 130 may be densified or hardened in comparison to the swelled domains 126 (FIG. 3). In addition to, or as another alternative to performing the etching process to remove the matrix 120, a conventional calcination process may be performed to remove the remaining polymer material from the swollen domains 126, the matrix 120, and the interface material 122. The calcination process may be performed, for example, by exposing the semiconductor structure 100 to temperatures at or above a decomposition temperature of the polymer material. By way of non-limiting example, the semiconductor structure 100 may be exposed to a temperature in a range of from about 300° C. to about 450° C. in a vacuum or in an inert atmosphere, such as argon or nitrogen. As another non-limiting example, the semiconductor structure 100 maybe exposed to ozone at a temperature in a range of from about 75° C. to about 95° C. The resulting semiconductor structure 100 includes laterally spaced metal oxide structures (not shown), which may have a similar structure to the metal oxide structures 130 shown in FIG. 4. Formation of the metal oxide structures 130 provides improved etch selectivity over the underlying materials in comparison to the domains 118 of the array 117 (FIG. 2) and the metal oxide-impregnated swollen domains 126 (FIG. 3). In this way, selective deposition of metal oxides into the specific regions of the self-assembled film 116 (FIG. 2) may be used to form an etching mask having feature sizes of less than or equal to 30 nm.

Figure 6:
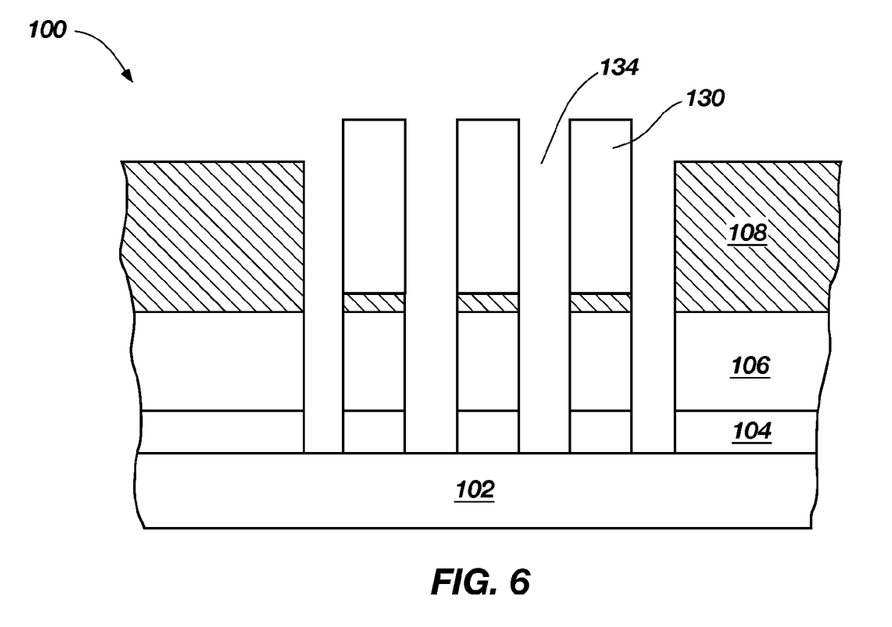
FIG. 6 is a partial cross-sectional view illustrating an embodiment of a patterning method utilizing metal oxide structures such as those fabricated using the method shown in FIGS. 1-4.

Referring to FIG. 6, because the underlying materials are selectively etchable with respect to the metal oxide structures 130, the metal oxide structures 130 may be used as a mask to pattern the underlying materials using, for example, conventional etching techniques. By way of non-limiting example, the apertures 134 between the metal oxide structures 130 may expose a surface 136 of the insulative material 108. The insulative material 108 may be removed using, for example, a dry etching process. The particular composition of the etchant used to remove the insulative material 108 exposed between apertures 134 selective to the metal oxide structures 130 may be selected based on the materials used for the insulative material 108 and the metal oxide structures 130. As a non-limiting example, if the insulative material 108 is silicon dioxide, a conventional dry etching process may be used to selectively remove the insulative material 108 without removing the metal oxide structures 130, exposing the underlying semiconductive material 106.

After removing the exposed portion of the insulative material 108, a portion of the semiconductive material 106 exposed through the apertures 134 may be selectively removed with respect to the metal oxide structures 130 using a dry plasma reactive ion etching (RIE) process. Subsequently, the underlying dielectric material 104 exposed through the apertures 134 may be removed using, for example, a dry plasma reactive ion etching (RIE) process. The semiconductive material 106 and the dielectric material 104 exposed through the apertures 134 may be removed using a single dry etching process or multiple dry etching processes.

The following examples serve to illustrate embodiments of the present invention in more detail. These examples are not to be construed as being exhaustive or exclusive as to the scope of this invention.

EXAMPLES

In each of the examples, a sample including a self-assembled film formed within trenches in a silicon dioxide material was used. To form the sample, a plurality of trenches having a width of about 200 nm were formed in a silicon dioxide material over and in contact with a polycrystalline silicon substrate using conventional deposition process and patterning processes. A polystyrene-block-polyvinylpyridine block (PS-b-PVP) copolymer material was spin-cast over the plurality of trenches in the silicon dioxide material to fill each of the trenches. The PS-b-PVP block copolymer was then heated to a temperature of about 200° C. to anneal the PS-b-PVP into a self-assembled film including ordered polyvinylpyridine (PVP) domains surrounded by a polystyrene (PS) matrix within each of the plurality of trenches. Each of the ordered PVP domains may have a width of about 20 nm.

Example 1

After annealing the PS-b-PVP block copolymer material, the sample was immersed in tetraethylorthosilicate for about 2 hours at a temperature of about 25° C. in air ambient while the tetraethylorthosilicate was absorbed into the PVP block polymer without substantially absorbing into the PS matrix, which caused swelling of the PVP block polymer.

Excess tetraethylorthosilicate (i.e., tetraethylorthosilicate which was not absorbed into the PVP block polymer) was removed from the sample using a spin-off process performed at about 3000 RPM for about 3 minutes. The tetraethylorthosilicate within the PVP block polymer was immersed and stirred in a deionized water bath for about 10 minutes at a temperature of about 70° C. to form silicon dioxide lines.

A rapid thermal anneal was performed to develop the silicon dioxide lines exposing the silicon dioxide lines to ozone at a temperature of about 85° C. for about 10 minutes and, thereafter, performing an oxygen plasma etching process for about 20 seconds.

Example 2

After annealing the PS-b-PVP block copolymer material, the sample was placed in a solution including a mixture of 2 parts by volume ethanol and 1 part by volume titanium tetra (isopropoxide). For about 1 hour, the self-assembled film was exposed to the ethanol/titanium tetra(isopropoxide) solution, which permeated the PVP block copolymer without substantially permeating the PS matrix, causing the ordered PVP domains to swell.

After exposure to the ethanol/titanium tetra (isopropoxide) solution, the self-assembled film was rinsed with ethanol to remove residual polymer material and was air dried. The sample was then exposed to water vapor at a temperature of about 25° C. for about 16 hours, which resulted in conversion of titanium tetra (isopropoxide) to titanium oxide within the ordered PVP domains.

Figure 7:
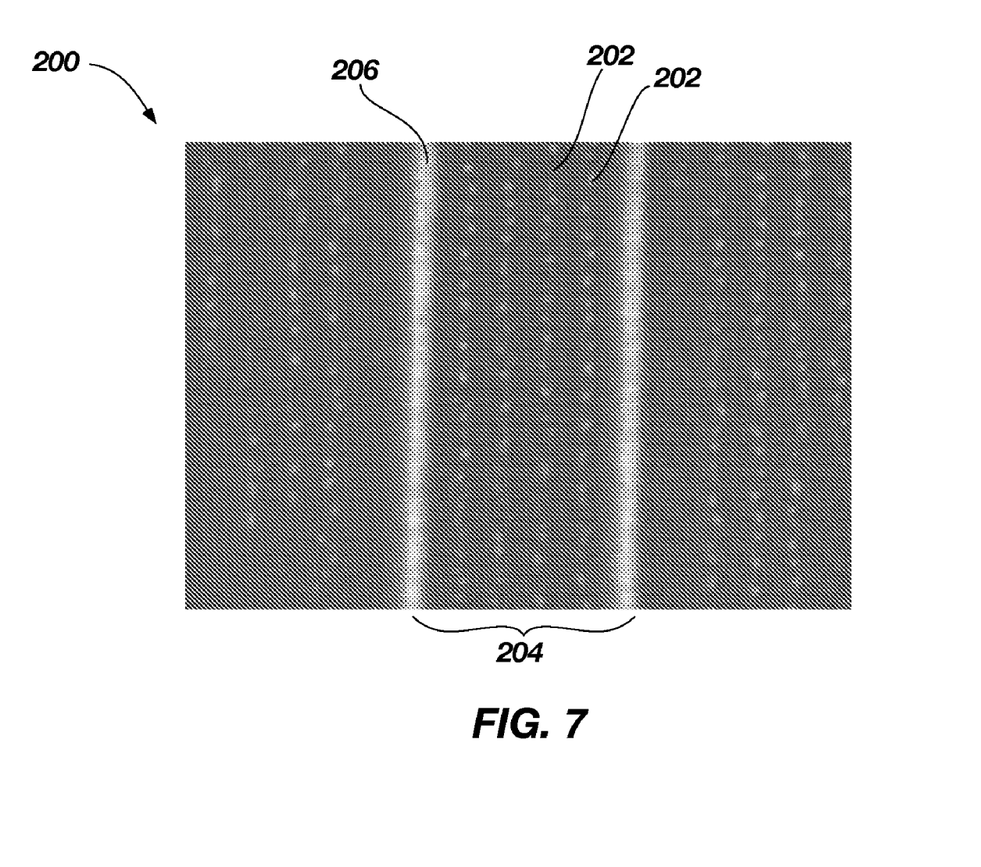
FIG. 7 is a scanning electron micrograph showing a top-down plan view of metal oxide lines formed on a semiconductor structure using embodiments of the present invention.

A reactive ion etching process was performed using oxygen gas at a flow rate of about 20 sccm, a pressure of 50 mTorr, at about 34 Watts for about 120 seconds to remove the PS from the sample. To removed residues and reveal titanium oxide lines, an etching process using tetrafluoromethane ($CF_4$) gas at a flow rate of about 100 sccm was performed. FIG. 7 is an SEM image showing a top-down view of the sample 200 having titanium dioxide lines 202 within trenches 204 thereon. Each of the titanium dioxide lines 202 is horizontally aligned with sidewalls 206 of the trenches 204.

Example 3

After annealing, the sample was exposed to a solution of tetraethylorthosilicate at about 24.0° C. for about 1 hour to enable the tetraethylorthosilicate to selectively penetrate the PVP domains. The sample was then exposed to water vapor at a temperature of about 60.0° C. in the sealed reactor chamber for about 16 hours. After exposure to the water vapor, the TEOS within the PVP domains had been converted to silicon dioxide to form a plurality of silicon dioxide lines in the trenches.

A reactive ion etching process was performed using oxygen gas at a flow rate of about 20 sccm, a pressure of 50 mTorr, at about 34 Watts for about 120 seconds to remove the PS from the sample revealing silicon dioxide lines.

Example 3

After annealing the PS-b-PVP block copolymer material, a layer of tetraethylorthosilicate was applied over the self-assembled film for about 2 hours to enable the tetraethylorthosilicate to permeate the PVP domains. Excess tetraethylorthosilicate was removed by spinning the sample at about 3000 rpm for about 3 seconds. Immediately after removal of the tetraethylorthosilicate, the sample was immersed in water at a temperature of about 70.0° C. for about 10 minutes.

The sample was dried and exposed to a vapor stream including 10% ozone/oxygen and was heated to a temperature of about 85.0° C. for about 10 minutes. The sample was dried and exposed to an oxygen plasma at a pressure of about 100 mTorr, at about 300 Watts for about 20 seconds. After treatment with the oxygen plasma, silicon dioxide lines were revealed in the PVP domains.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming metal oxide structures, comprising:
    applying a material comprising at least two polymeric blocks that are substantially immiscible with one another over at least one trench in a dielectric material overlying a substrate;
    annealing the material to form a film comprising repeating domains aligned with one another within the at least one trench, comprising at least one of the polymeric blocks, and surrounded by a matrix comprising at least another of the polymeric blocks;
    exposing the film to a swelling agent comprising at least one metal oxide precursor; and
    oxidizing the at least one metal oxide precursor to form a metal oxide.

2. The method of claim 1, wherein applying a material comprising at least two polymeric blocks comprises applying a block copolymer comprising polyvinylpyridine and polystyrene.

3. The method of claim 1, wherein exposing the film to a swelling agent comprising at least one metal oxide precursor comprises permeating the repeating domains with the at least one metal oxide precursor.

4. The method of claim 1, wherein exposing the film to a swelling agent comprising at least one metal oxide precursor comprises exposing the film to the swelling agent comprising at least one metal oxide precursor selected from the group consisting of a metal alkoxide, an isopropoxide, and a metal salt.

5. The method of claim 1, wherein exposing the film to a swelling agent comprising at least one metal oxide precursor comprises exposing the film to a mixture of a solvent and at least one metal alkoxide.

6. The method of claim 1, wherein exposing the film to a swelling agent comprising at least one metal oxide precursor comprises exposing the film to a mixture of ethanol and titanium tetraisopropoxide.

7. The method of claim 1, wherein oxidizing the at least one metal oxide precursor to form a metal oxide comprises oxidizing titanium tetraisopropoxide to titanium dioxide.

8. The method of claim 1, wherein exposing the film to a swelling agent comprising at least one metal oxide precursor comprises exposing the film to a metal oxide precursor which selectively bonds to the repeating domains.

9. The method of claim 1, wherein annealing the material to form a film comprising repeating domains aligned with one another within the at least one trench comprises annealing the material to form the film comprising the repeating domains, each domain of the repeating domains horizontally aligned with sidewalls of the at least one trench.

10. A method for selectively permeating a self-assembled block copolymer, comprising:

applying a block copolymer comprising a hydrophilic polymer and a hydrophobic polymer in at least one trench in a dielectric material;
inducing phase separation in the block copolymer to form a plurality of domains comprising the hydrophilic polymer within the at least one trench surrounded by a matrix comprising the hydrophobic polymer;
contacting the plurality of domains with a swelling agent comprising at least one metal oxide precursor to selectively permeate the plurality of domains; and
exposing the plurality of domains to an oxidizing agent to convert the at least one metal oxide precursor to a metal oxide.

11. The method of claim 10, wherein inducing phase separation in the block copolymer to form a plurality of domains comprises heating the block copolymer to a temperature at or above a glass transition temperature and below a degradation temperature thereof to form a plurality of cylinders parallel to an axis of the at least one trench.

12. The method of claim 10, wherein contacting the plurality of domains with a swelling agent comprises applying a mixture of an alcohol and at least one metal alkoxide precursor.

13. The method of claim 10, wherein exposing the plurality of domains to an oxidizing agent to convert the at least one metal oxide precursor to a metal oxide comprises exposing the plurality of domains to at least one of water vapor, ozone, or oxygen gas at a temperature of about 25° C.

14. The method of claim 10, further comprising heating the plurality of domains and the matrix to a temperature of at least a degradation temperature thereof to remove the hydrophilic polymer and the hydrophobic polymer.

15. A method of forming a metal oxide pattern on a substrate, comprising:
applying a block copolymer material over at least one trench in a dielectric material, the block copolymer material comprising at least one hydrophilic polymer and at least one hydrophobic polymer;
annealing the block copolymer material to form a plurality of structural units laterally aligned with the at least one trench and comprising the at least one hydrophilic polymer, the plurality of structural units disposed within a matrix comprising the at least one hydrophobic polymer;
applying a swelling agent comprising a metal oxide precursor to the plurality of structural units to form a plurality of metal oxide precursor-impregnated structural units;
exposing the metal oxide precursor-impregnated structural units to at least one oxidizing agent to oxidize the metal oxide precursor; and
removing the matrix to form a pattern of metal oxide structures.

16. The method of claim 15, wherein applying a block copolymer material over at least one trench in a dielectric material comprises applying the block copolymer material over the at least one trench having a depth of from about 15 nm to about 50 nm.

17. The method of claim 15, wherein applying a swelling agent comprising a metal oxide precursor to the plurality of structural units comprises applying a swelling agent comprising titanium tetraisopropoxide to the plurality of structural units for about one hour.

18. The method of claim 15, wherein applying a swelling agent comprising a metal oxide precursor to the plurality of structural units comprises applying a tetraethylorthosilicate to the plurality of structural units for about one hour.

19. The method of claim 15, wherein exposing the metal oxide precursor-impregnated structural units to at least one oxidizing agent comprises exposing the metal oxide precursor-impregnated structural units to water vapor for from about 1 minute to about 30 hours.

20. The method of claim 15, wherein exposing the metal oxide precursor-impregnated structural units to at least one oxidizing agent comprises exposing the metal oxide precursor-impregnated structural units to at least one of oxygen, nitrogen dioxide, water, nitrogen tetroxide, and ozone.

21. The method of claim 15, wherein removing the matrix to form a pattern of metal oxide structures comprises etching the matrix using an oxygen plasma.

22. A method of patterning a semiconductor structure, comprising:
applying a copolymer material comprising at least two substantially immiscible polymeric blocks over at least one trench in a material overlying a substrate;
annealing the copolymer material to form a plurality of domains aligned with one another within the at least one trench, each of the domains comprising at least one of the polymeric blocks;
exposing the plurality of domains to a swelling agent comprising at least one metal oxide precursor;
oxidizing the at least one metal oxide precursor to form a plurality of metal oxide structures; and
selectively removing the material overlying the substrate with respect to the metal oxide structures of the plurality.

23. A method of forming metal oxide structures, comprising:
applying a material comprising at least two polymeric blocks that are substantially immiscible with one another over at least one trench in a material overlying a substrate;
annealing the material to form a film comprising repeating domains comprising at least one of the polymeric blocks surrounded by a matrix comprising at least another of the polymeric blocks;
exposing the film to a swelling agent comprising titanium tetraisopropoxide; and
oxidizing the titanium tetraisopropoxide to form titanium dioxide.

24. The method of claim 23, wherein annealing the material to form a film comprising repeating domains comprises annealing the material to form a film comprising repeating domains substantially aligned with one another within the at least one trench.

* * * * *